US010558236B2

(12) United States Patent
Ho et al.

(10) Patent No.: US 10,558,236 B2
(45) Date of Patent: Feb. 11, 2020

(54) DIRECT DIGITAL SYNTHESIS SYSTEMS AND METHODS

(71) Applicant: Lattice Semiconductor Corporation, Portland, OR (US)

(72) Inventors: Vinh Ho, Milpitas, CA (US); Magathi Jayaram Willis, San Jose, CA (US); Keith Truong, San Jose, CA (US); Hamid Ghezelayagh, San Jose, CA (US)

(73) Assignee: Lattice Semiconductor Corporation, Portland, OR (US)

(*) Notice: Subject to any disclaimer, the term of this patent is extended or adjusted under 35 U.S.C. 154(b) by 0 days.

(21) Appl. No.: 16/019,472

(22) Filed: Jun. 26, 2018

(65) Prior Publication Data

US 2019/0004561 A1    Jan. 3, 2019

Related U.S. Application Data

(60) Provisional application No. 62/552,351, filed on Aug. 30, 2017, provisional application No. 62/552,347, filed on Aug. 30, 2017, provisional application No. 62/526,983, filed on Jun. 29, 2017.

(51) Int. Cl.
*G06F 1/03* (2006.01)
*G06F 17/50* (2006.01)
*H03M 1/66* (2006.01)
*G06F 1/08* (2006.01)

(52) U.S. Cl.
CPC .............. *G06F 1/0321* (2013.01); *G06F 1/08* (2013.01); *G06F 17/5054* (2013.01); *H03M 1/66* (2013.01)

(58) Field of Classification Search
CPC . G06F 1/00; G06F 1/03; G06F 1/0321; G06F 1/0328; G06F 1/0342; G06F 1/0353; G06F 1/08; G06F 17/00; G06F 17/50; G06F 17/5054; G06F 7/00; G06F 7/68; H03M 1/00; H03M 1/66
USPC ........................................................ 327/106
See application file for complete search history.

(56) References Cited

U.S. PATENT DOCUMENTS 8,947,281 B1* 2/2015 Azarmnia ............... H03M 1/66
                                                 341/144
2016/0359496 A1* 12/2016 Thomsen ............... H03K 5/003
2016/0373124 A1* 12/2016 Kijima .................... H03M 1/38

* cited by examiner

*Primary Examiner* — Lincoln D Donovan
*Assistant Examiner* — Dave Mattison
(74) *Attorney, Agent, or Firm* — Haynes and Boone, LLP

(57) ABSTRACT

A direct digital synthesizer (DDS) is controlled by a suitably configured programmable logic device (PLD). The DDS includes a digital analog converter (DAC), and a coupled driver/buffer configured to drive relatively high capacitive loads with substantially rail to rail sinusoidal driver output signals and with little to no waveform distortion. The DAC includes a PMOS and NMOS DACs, and a switch configured to select the PMOS DAC for negative portions and the NMOS DAC for positive portions of an output analog signal generated by the DAC. The driver includes a pair of input differential amplifiers, PMOS and NMOS structures, which may be variable, and a pair of variable current sources. The PLD controls variable elements of the DDS to adjust the achievable positive and negative slew rates of the DDS, independently of one another, to reduce or eliminate risk of signal distortion while maintaining substantially stable rail to rail output.

20 Claims, 9 Drawing Sheets

DIRECT DIGITAL SYNTHESIS SYSTEMS AND METHODS

CROSS-REFERENCE TO RELATED APPLICATIONS

This application claims the benefit of and priority to U.S. Provisional Patent Application No. 62/526,983 filed on Jun. 29, 2017 and entitled "SYSTEMS AND METHODS OF DIRECT DIGITAL SYNTHESIS," which is hereby incorporated by reference in its entirety.

This application claims the benefit of and priority to U.S. Provisional Patent Application No. 62/552,347 filed on Aug. 30, 2017 and entitled "DIRECT DIGITAL SYNTHESIS SYSTEMS AND METHODS," which is hereby incorporated by reference in its entirety.

This application claims the benefit of and priority to U.S. Provisional Patent Application No. 62/552,351 filed on Aug. 30, 2017 and entitled "DIRECT DIGITAL SYNTHESIS SYSTEMS AND METHODS," which is hereby incorporated by reference in its entirety.

TECHNICAL FIELD

The present disclosure relates generally to digital synthesizer systems, and in particular, to relatively high performance direct digital synthesizer systems able to drive high impedance loads.

BACKGROUND

Direct digital synthesizers (DDSs) are often used to generate analog signals to drive various types of circuit elements according to a desired frequency, amplitude, relative phase, or other signal characteristic. For example, such analog signals may be used to energize a sensor circuit or system in order to produce sensor output that may, in turn, be measured and/or processed to detect a desired environmental condition or event associated with the sensor circuit or system. The performance (e.g., sensitivity, responsiveness) of such sensor circuits often depends on the performance (e.g., accuracy, bandwidth, and efficiency) of the DDSs used to energize the sensor circuits.

Conventional solutions suffer from a variety of disadvantages, particularly in relatively low-power applications (e.g., mobile, battery-powered, or low dissipated heat applications). For example, conventional digital to analog circuits (DACs) and/or associated driver circuits for direct digital synthesizers often suffer from relatively high quiescent current draws, which can severely limit their applicability in such low-power applications.

Thus, there is a need in the art for a relatively high performance yet low-power-capable direct digital synthesizer system.

Figure 1:
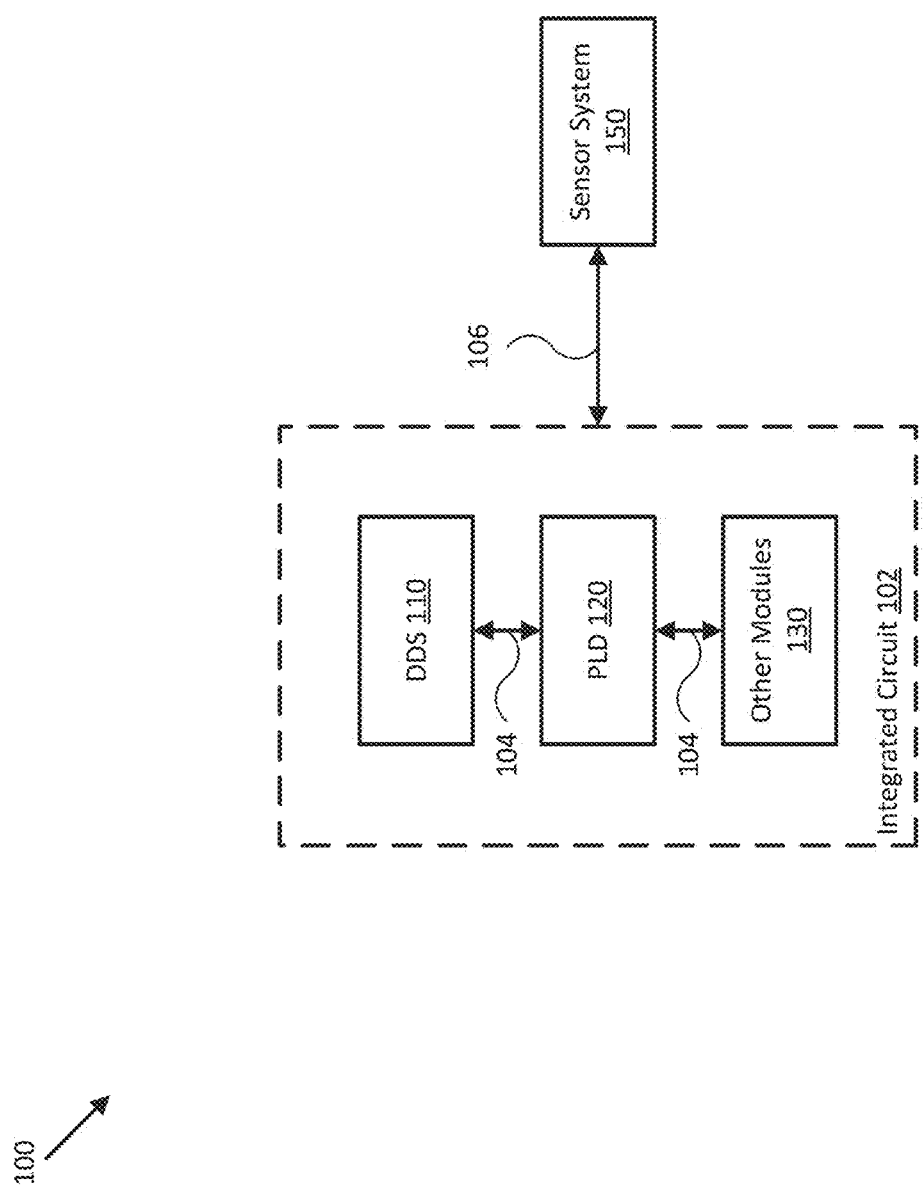
FIG. 1 is a block diagram illustrating a direct digital synthesis system in accordance with an embodiment of the present disclosure.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION

The present disclosure provides systems and methods for direct digital synthesis, such as the type of signal synthesis and delivery circuity used to energize various types of sensor systems and/or other circuity used to provide an interface between a digital system (e.g., a computer, mobile device, and/or other digital system) with the physical world. For example, embodiments provide systems and methods of improving the general performance and efficiency of corresponding direct digital synthesizers (DDSs), particularly as it pertains to providing analog signals to sensor circuity and/or systems, as described herein.

FIG. 1 is a block diagram illustrating a direct digital synthesis system 100 in accordance with an embodiment of the present disclosure. As shown in FIG. 1, system 100 may include direct digital synthesizer (DDS) 110, programmable logic device (PLD) 120, and various other modules 130 configured to excite and/or measure a response from sensor system 150. In some embodiments, one or more of DDS 110, PLD 120, other modules 130, and/or various elements of sensor system 150 may be fabricated within a monolithic integrated circuit 102, as shown.

DDS 110 may be implemented with digital to analog circuitry, driver circuitry, and/or other circuitry configured to receive a digital signal (e.g., generated by PLD 120 and/or other logic of system 100), convert the digital signal into a corresponding analog signal, and drive sensor system 150 by providing the analog signal as an output driver signal to sensor system 150. DDS 110 may be configured to receive the digital signal over one or more elements of interface 104 and to provide the corresponding analog signal over interface 106. In some embodiments, DDS 110 may be a multichannel DDS, as described herein. Interface 104 may include one or more electrical traces, wires, cables, and/or other electrical conduits facilitating various types of digital communication between DDS 110, PLD 120, and other modules 130. In some embodiments, interface 104 may include electrical conduits facilitating transmission of various types of analog signals between DDS 110, PLD 120, and other modules 130. Interface 106 may include one or more electrical traces, wires, cables, and/or other electrical conduits and/or interfaces facilitating transmission of various types of analog signals between at least DDS 110 and sensor system 150. In some embodiments, interface 106 may include electrical conduits facilitating various types of digital communication between elements of integrated circuit 102, for example, and sensor system 150, such as digital control and/or feedback signals transmitted to/from sensor system 150 over interface 106.

PLD 120 may be implemented by one or more field programmable gate array (FPGAs), complex programmable logic devices (CPLDs), field programmable systems on a chip (FPSCs), and/or or other types of programmable devices, for example, and may be configured to control operation of various elements of system 100. For example, PLD 120 may be configured to generate a digital signal or signals corresponding to a desired analog signal or waveform, for example, and provide such digital signal or signals to DDS 110 in order to control DDS 110 to generate such desired analog signal or waveform. In some embodiments, PLD 120 may be configured to provide such digital signal(s) to an intermediary logic device (e.g., other modules 130) to facilitate generation of a relatively stable waveform without requiring PLD 120 to remain fully powered. PLD may also be configured to receive sensor signals (e.g., analog or digital sensor signals, generated by sensor system 150 and/or other modules 130), corresponding to the output driver signals provided by DDS 110 to sensor system 150, and process such sensor signals to measure and/or detect a sensed or desired event. In addition, PLD 120 may be configured to control operation of elements of system 100, such as any variable and/or programmable circuit elements, for example, to calibrate and/or stabilize operation of DDS 100, as described herein. More generally, in some embodiments, PLD 120 may be implemented according to the systems and methods described in U.S. patent application Ser. No. 15/658,356 filed Jul. 24, 2017 and entitled "MULTIPLE MODE DEVICE IMPLEMENTATION FOR PROGRAMMABLE LOGIC DEVICES," which is hereby incorporated by reference in its entirety.

Other modules 130 may include various analog and/or digital circuit elements, circuits, and/or systems configured to facilitate operation of system 100. For example, other modules 130 may include bias circuitry, digital and/or analog interface circuitry (e.g., multiplexors, test loads, filters), clock circuitry (e.g., including phase locked loop circuitry, external clock interfaces, and/or internal clock distribution circuitry), analog to digital converters, volatile and non-volatile memory (e.g., a machine readable medium, for storing non-transitory instructions for loading into and execution by PLD 120 and/or other logic devices of system 100). Sensor system 150 may include one or more sensors and/or sensor elements configured to sense an aspect of the physical world. In general, sensor system 150 may be configured to receive analog excitation signals from DDS 110 and provide corresponding analog sensor signals back to other elements of system 100. For example, such sensor signals may represent a change in an impedance of a sensor element of sensor system 150 corresponding to a change in the physical environment about that sensor element.

Figure 2:
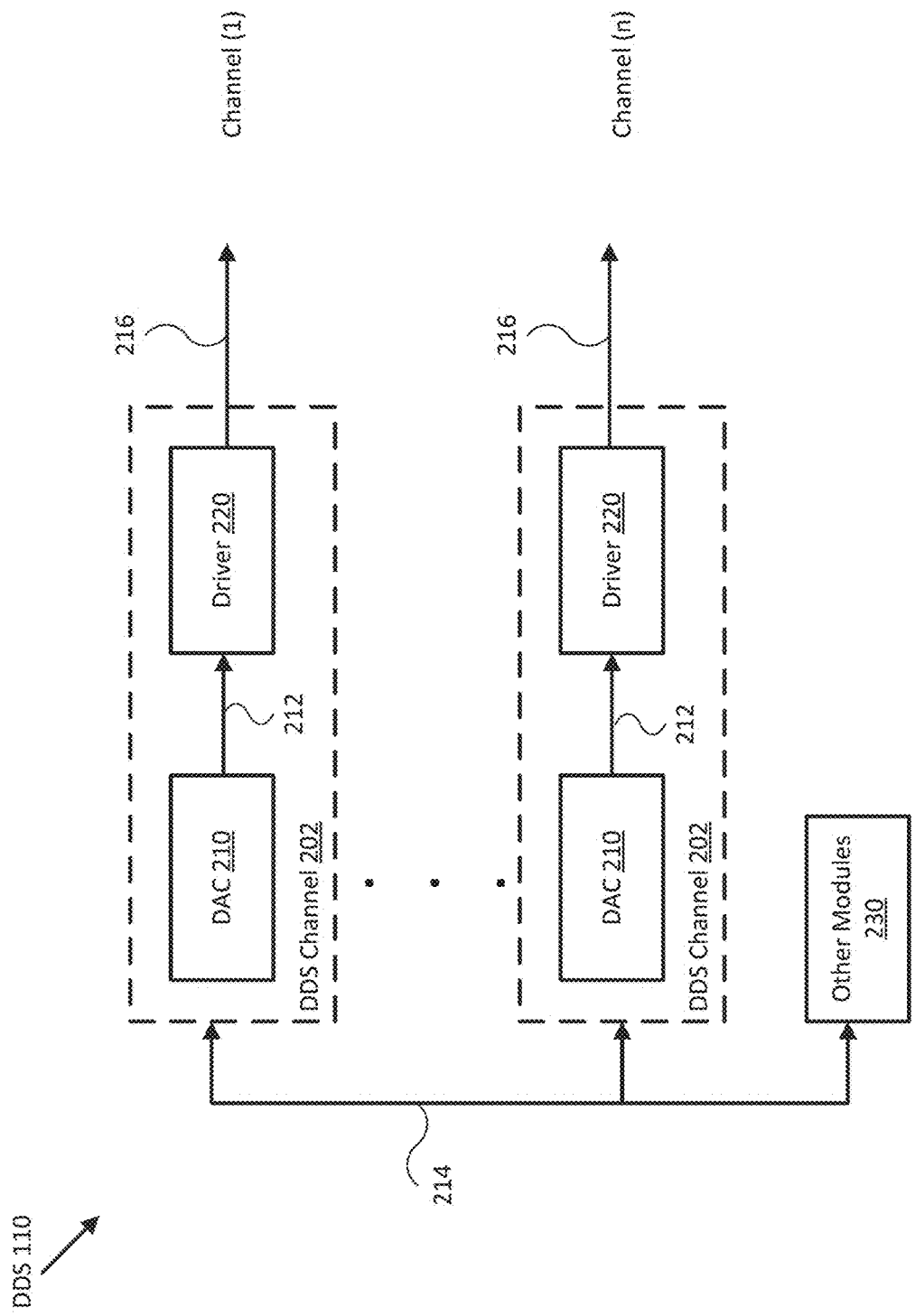
FIG. 2 is a block diagram illustrating a direct digital synthesizer in accordance with an embodiment of the present disclosure.

FIG. 2 is a block diagram illustrating a DDS 110 in accordance with an embodiment of the present disclosure. As shown in FIG. 2, DDS 110 may include one or more DDS channels 202, each including a DAC 210 configured to provide an analog signal over interface 212 to a corresponding driver/buffer 220, and various other modules 230, which may be coupled to DDS channels 202 at least over interface 214. DAC 210 may be implemented as a differential current-steering DAC and/or according to one or more other DAC designs and be configured to receive a digital control signal (e.g., from PLD 120) and generate a corresponding analog signal and/or waveform output and provide the corresponding analog signal output to driver 220 over interface 212. Interface 212 may include one or more electrical traces, wires, cables, and/or other electrical conduits and/or interfaces facilitating transmission of various types of analog signals from DAC 210 to driver 220. In some embodiments, interface 212 may include electrical conduits facilitating various types of digital communication between elements of DDS channel 202.

Driver 220 may be implemented with various active, passive, and/or variable circuit elements configured to receive analog signals from DAC 210 (e.g., over interface 212) and generate a corresponding output analog signal configured to drive a desired output impendence (e.g., elements of sensor system 150) without distortion, such as a rail to rail sinusoidal waveform over interface 216 without substantial distortion and according to one or more desired signal and/or load characteristics, as described herein. Interface 216 may include one or more electrical traces, wires, cables, and/or other electrical conduits and/or interfaces facilitating transmission of various types of analog signals from driver 210 over 216 (e.g., to sensor system 150).

Other modules 230 may include various analog and/or digital circuit elements, circuits, and/or systems configured to facilitate operation of DDS 110. For example, other modules 230 may include bias circuitry (e.g., including voltage and/or current source/sink, reference, regulation, and/or associated control circuitry), digital and/or analog interface circuitry (e.g., multiplexors, test loads, filters), clock circuitry (e.g., including phase locked loop circuitry, external clock interfaces, and/or internal clock distribution circuitry), electrostatic discharge protection circuitry, and/or logic signal decoder circuitry. Interface 214 may include one or more electrical traces, wires, cables, and/or other electrical conduits and/or interfaces facilitating transmission of various types of digital and/or analog signals between elements of DDS 110.

Figure 3:
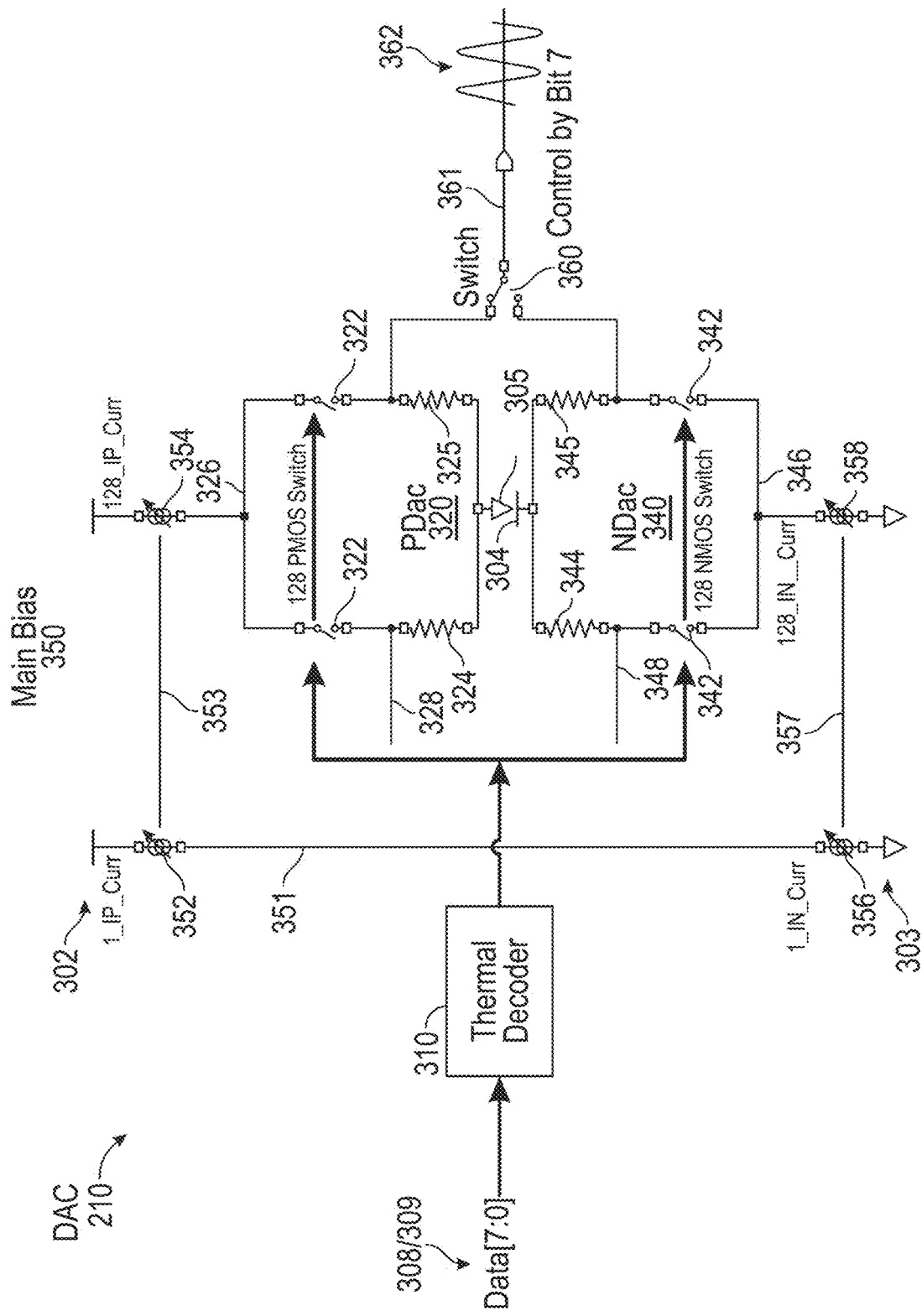
FIG. 3 is a block diagram illustrating a digital to analog circuit for a direct digital synthesizer in accordance with an embodiment of the present disclosure.

FIG. 3 is a block diagram illustrating a DAC 210 for DDS 110 in accordance with an embodiment of the present disclosure. As shown in FIG. 3, DAC 210 may include a decoder 310 controlling operation of switches within p-type metal-oxide-semiconductor (PMOS) DAC 320 and n-type metal-oxide-semiconductor (NMOS) DAC 340 and operation of switch 360 to generate analog signal 362 at output 361. DAC 210 may also include bias circuitry 350 (e.g., including one or more of elements 302-303, 351-358, and 304-305) configured to bias PMOS DAC 320 and NMOS DAC 340 according to one or more desired bias voltages (e.g., to generate a substantially rail to rail and/or distortion-free output waveform 362). In particular decoder 310 may be configured to receive digital signal/data 308 at input 309 and output a corresponding decoded digital signal to PMOS DAC 320 and NMOS DAC 340 in order for PMOS DAC 320 and NMOS DAC 340 to generate a substantially positive (NMOS DAC 340) or negative (PMOS DAC 320) portion of waveform 362 (e.g., relative to midline portion or average of waveform 362). Decoder 310 (e.g., and/or other circuitry of DAC 210 and/or DDS 110) may also be configured to provide a most significant bit and/or other portion of digital signal/data 309 to switch 360 to select an output of PMOS DAC 320 or NMOS DAC 340 to generate a corresponding negative or positive portion of waveform 362. Such selection may be used to select the DAC output with the least amount of distortion for the corresponding negative or positive portion of waveform 362, as described herein. In various embodiments, decoder 310 may be implemented as a thermal decoder.

In the embodiment shown in FIG. 3, PMOS DAC 320 may be implemented as a 7-bit DAC with a series of 128 PMOS switches (e.g., transistors) 322 coupled substantially in parallel between common bias 326 and reference resistor 325 and arranged to form at least a portion of a differential current steering DAC. In other embodiments, PMOS DAC 320 may be implemented with other numbers of PMOS switches in order to provide digital to analog conversion according to other bit-depths. Similarly, NMOS DAC 340 is shown in FIG. 3 as a 7-bit DAC with a series of 128 NMOS switches 342 coupled substantially in parallel between common bias 346 and reference resistor 345 and arranged to form at least a portion of a differential current steering DAC, but NMOS DAC 340 may alternatively be implemented with a different number of NMOS switches in order to provide digital to analog conversion according to other bit-depths. In various embodiments, PMOS DAC 320 may be implemented with alternative output 328 referenced to reference resistor 324, and/or NMOS DAC 340 may be implemented with alternative output 348 referenced to reference resistor 344.

As noted herein, bias circuitry 350 may include one or more of elements 302-303, 351-358, and 304-305, for example, and be configured to bias PMOS DAC 320 and/or NMOS DAC 340 according to a desired bias voltage. As shown in FIG. 3, bias circuitry includes VDD or "high" rail reference 302, ground or "low" rail reference 303, and various variable/programmable current sources/sinks/mirrors 352, 354, 356, and 358, which may be controlled to provide a desired bias voltage at PMOS/NMOS DAC common bias 326 and/or 346. Such common biases may be used to compensate for thermal and/or other circuit fluctuations throughout DAC 210 and/or between multiple DACs 210 (e.g., in a multichannel DDS 110, as shown in FIG. 2). In particular, current sources/sinks/mirrors 352 and 356 may be configured to provide a DDS common bias 351 relative to VDD 302 and ground 303 for all DACs 210 in a multichannel DDS 110, and local variable/programmable current sources/mirrors 354 (e.g., a PMOS current source) and 358 (e.g., an NMOS current source), linked respectively to and controlled by current sources 352 and 356 via bias control references/lines 353 and 357, may be configured to provide respective common biases 326 and 346 to PMOS DAC 320 and NMOS DAC 340, respectively, as shown. Such arrangement allows DAC 210 to be operated at substantially any common bias 351 between VDD 302 and ground 303. For example, in some embodiments, internal NMOS/PMOS DAC reference rails 304/305 may be linked or electrically coupled directly to VDD 302 and ground 303, respectively.

Figure 4:
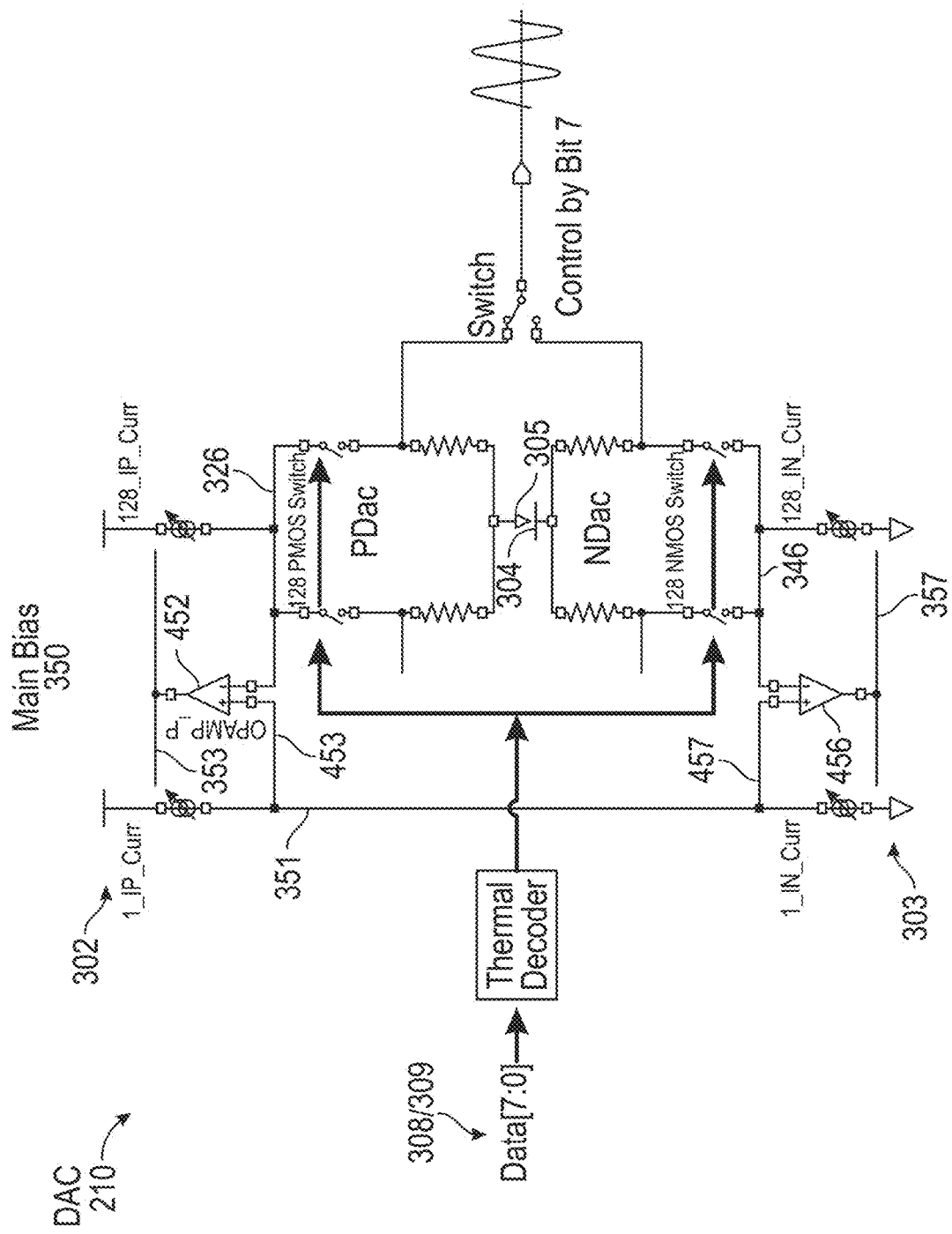
FIG. 4 is a block diagram illustrating a digital to analog circuit for a direct digital synthesizer in accordance with an embodiment of the present disclosure.

FIG. 4 is a block diagram illustrating a DAC 210 for DDS 110 in accordance with an embodiment of the present disclosure. DAC 210 of FIG. 4 includes all the same elements of DAC 210 shown in FIG. 3, but additionally includes feedback element 452 coupled between DDS common bias 351/453, PMOS DAC common bias 326, and bias control reference 353, and feedback element 456 coupled between DDS common bias 351/457, NMOS DAC common bias 346, and bias control reference 357. In various embodiments, feedback elements 452 and 456 may be configured to detect drift or a voltage difference between DDS common bias 351 and respective DAC common biases 326 and 346, for example, and compensate for such drift or difference by adjusting respective bias control references 353 and/or 357.

In various embodiments, feedback elements 452 and 456 may be implemented as differential amplifiers, as shown.

Figure 5:
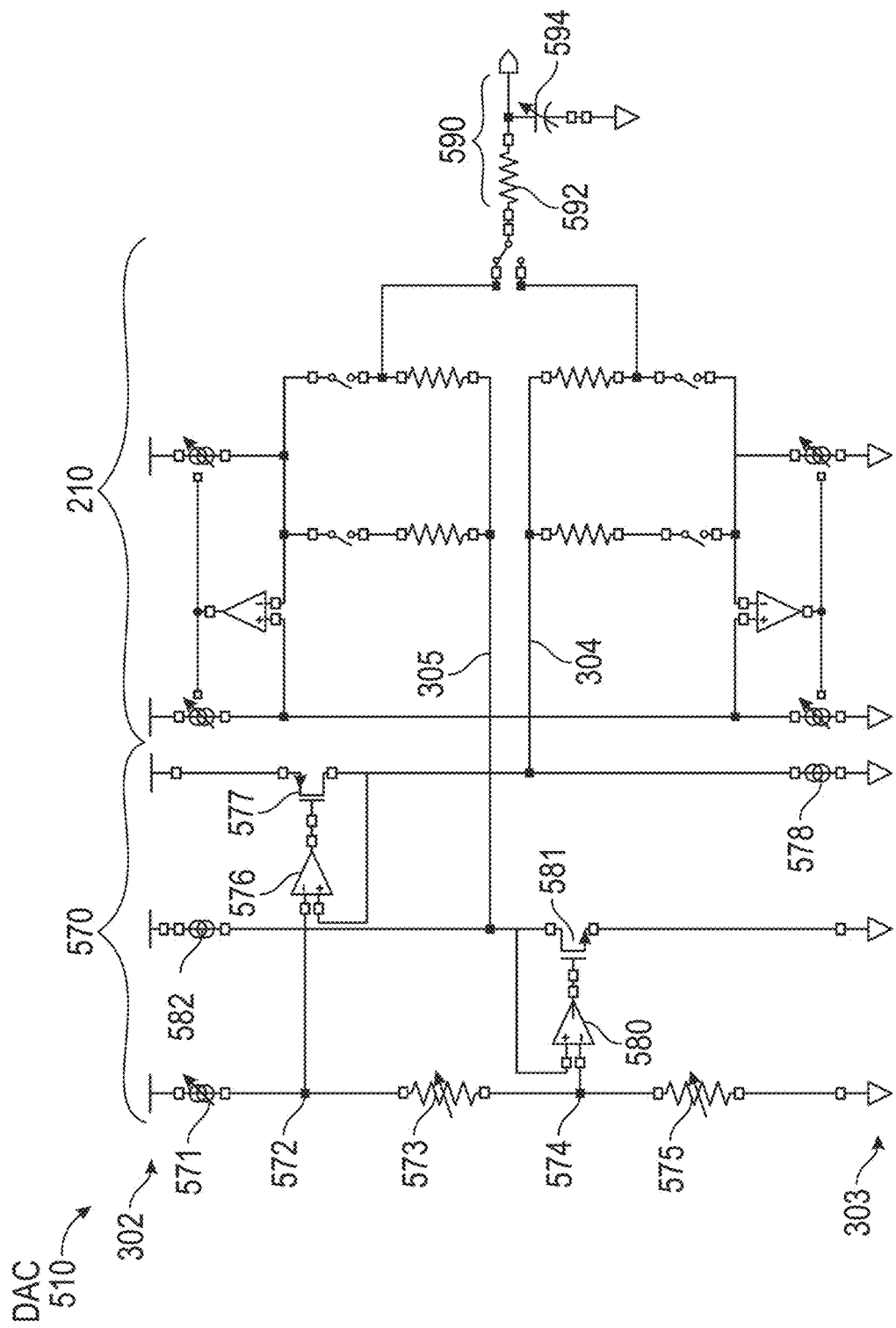
FIG. 5 is a block diagram illustrating a digital to analog circuit for a direct digital synthesizer in accordance with an embodiment of the present disclosure.

FIG. 5 is a block diagram illustrating a DAC 510 for DDS 110 in accordance with an embodiment of the present disclosure. DAC 510 of FIG. 5 includes all the same elements of DAC 210 shown in FIG. 3 or 4, but additionally includes bias regulator 570 configured to exchange a portion of the achievable peak to peak amplitude of waveform 362 for additional stability in the amplitude, shape, distortion, and/or other characteristic of waveform 362, as across multiple channels of DAC 210 in a multichannel DDS 110, such as that shown in FIG. 2. Optionally, DAC 510 may also include an output filter 590, which may be a variable/programmable output filter including a variable/programmable capacitance 594 and/or resistor 592, among other circuit elements, for example. Such output filter may be configured as a low, high, or band pass filter configured to filter the output analog signal of DAC 510 according to a desired pass band.

As shown in FIG. 5, bias regulator 570 of DAC 510 may be configured to select, regulate, or otherwise control internal NMOS/PMOS DAC reference rails 304/305 (e.g., as shown in FIGS. 3 and 4) through use of variable/programmable current sources/mirrors 571, 582, and 578, variable/programmable resistors 573 and 575, and feedback element pairs 576/577 and 580/581. For example, variable current source 571 and variable resistors 573 and 575 may be controlled to select a "high" virtual rail 572 and a "low" virtual rail 574, as shown. High virtual rail 572 may be provided to feedback element pair 576/577, which may be configured to force internal NMOS DAC reference rail 304 to be substantially equal to high virtual rail 572 regardless of thermal and/or other voltage drift caused by, for example, non-variable/programmable (e.g., smaller footprint) current source 578 and/or elements of DAC 210. Similarly, low virtual rail 574 may be provided to feedback element pair 580/581, which may be configured to force internal PMOS DAC reference rail 305 to be substantially equal to low virtual rail 574 regardless of thermal and/or other voltage drift caused by, for example, non-variable/programmable (e.g., smaller footprint) current source 582 and/or elements of DAC 210. As such, PMOS DAC 320 and NMOS DAC 340 will operate under a lower total bias, thereby limiting their individual peak amplitude outputs, but the additional variable overhead for each individual DAC 210 allows multiple DACs within a multichannel DDS to provide output signals that are extremely accurate and reliable relative to each other (e.g., a particular data signal 309 provided to different channels of a multichannel DDS 110 will produce substantially the same analog signal output at each one of the different channels).

In some embodiments, variable/programmable resistors 573 and/or 575 may be implemented with variable/programmable current sources. Feedback element pair 576/577 may be implemented with a differential amplifier and a PMOS transistor, as shown, to reduce layout constraints. Similarly, feedback element pair 580/581 may be implemented with a differential amplifier and an NMOS transistor, as shown. Bias regulator 570 may be implemented per DAC in a multichannel DDS, for example, or may be implemented with elements that are common to multiple DACs within a multichannel DDS. For example, in some embodiments, elements 571, 573, and 575 may produce common virtual rails 572 and 574 that may be routed to multiple DACs 210 each including their own elements 576-582. In other embodiments, each of elements 571-582 may produce common NMOS/PMOS DAC reference rails 304/305 that are routed to multiple DACs 210.

Figure 6:
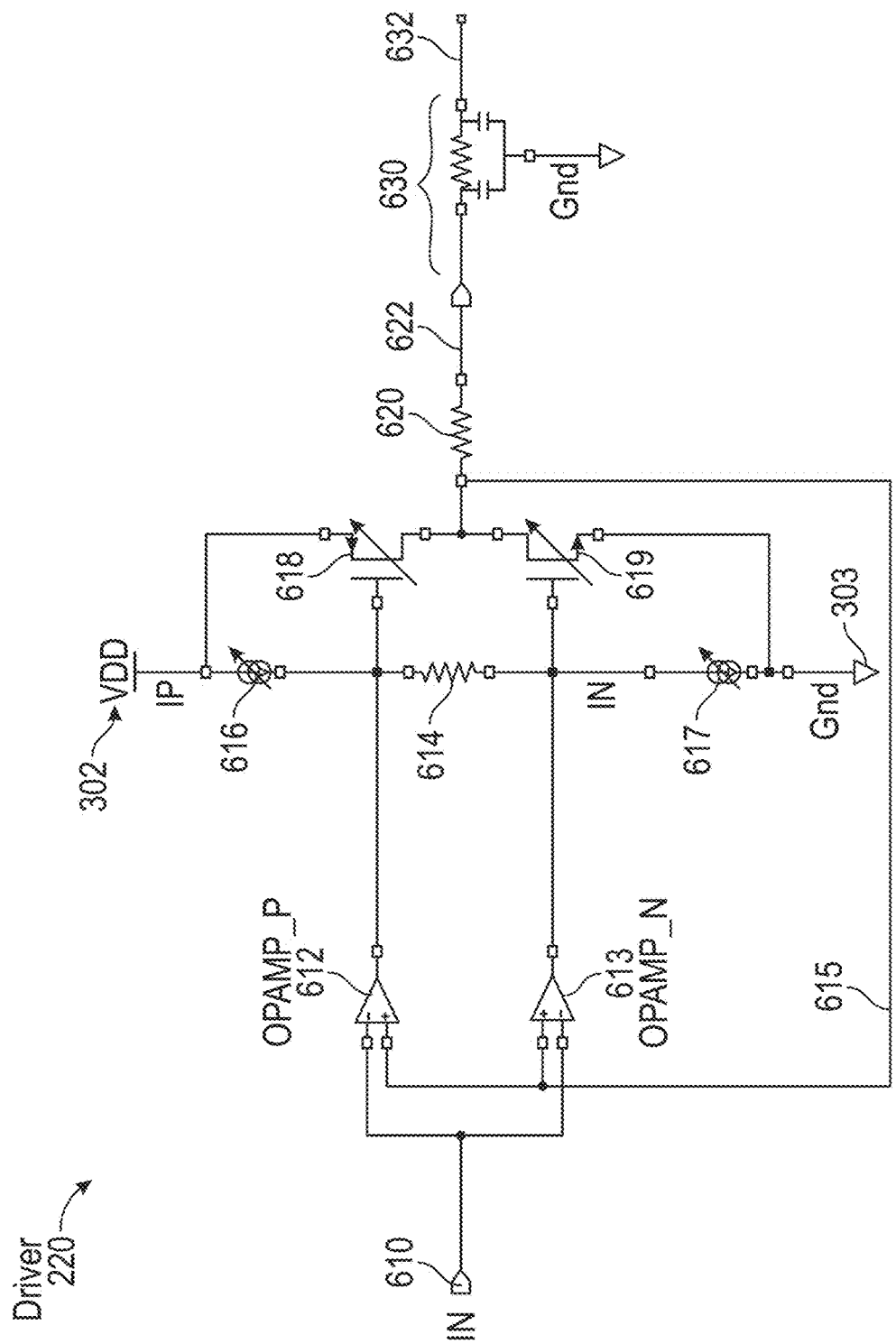
FIG. 6 is a block diagram illustrating a driver circuit for a direct digital synthesizer in accordance with an embodiment of the present disclosure.

FIG. 6 is a block diagram illustrating a driver 220 for DDS 110 in accordance with an embodiment of the present disclosure. As shown in FIG. 6, driver 220 includes input differential amplifiers 612 and 613 (e.g., which may be implemented substantially with PMOS or NMOS circuit elements to reduce layout constraints, as shown, and/or may be implemented as operational amplifiers, as shown) configured to receive substantially rail to rail analog signals at input 610 (e.g., such as those provided by DACs 210 and/or 510), variable/programmable PMOS and NMOS output transistor structures 618 and 619 configured to provide independent coarse tuning of the respective negative and positive slew rate of driver 220, and variable/programmable current sources 616 and 617 and cross link resistor 614 configured to provide independent fine tuning of the respective negative and positive slew rate of driver 220. Such arrangement may be configured to provide substantially distortion-free rail to rail analog output driver signals (e.g., sinusoid or sine-wave signals) capable of driving a 15-100 pF capacitive load at frequencies ranging at least from 50 kHz to 2 MHz, substantially without distortion of the waveform.

In some embodiments, the value of cross link resistor 614 may be selected to help the transconductance of driver 220, and in particular the pair of amplifiers 612 and 613, to remain substantially constant over changes in an analog signal or waveform provided to input 610, and/or to produce quicker response to common mode variations in the signals reaching the inputs of amplifiers 612 and 613 (e.g., through input 610 and feedback link 615), which helps driver 220 to provide relatively flat or constant average output levels. In some embodiments, the value of cross link resistor 614 may be selected to reduce or eliminate current draw while driver 220 is inactive or "turned off." In various embodiments, cross link resistor 614 may be implemented by a variable/programmable resistor. PMOS and NMOS transistor structures 618 and 619 may each be implemented as a series of PMOS or NMOS transistors (e.g., 4 transistors), respectively, arranged in parallel, that can be individually switched into and out of driver 220 to adjust the respective negative and positive achievable slew rates for driver 220 for different loads and frequencies (e.g., different output signal characteristics and output impendences) by adjusting the available current and capacitance of the respective structures. In some embodiments, PMOS and NMOS transistor structures 618 and 619 may include or be represented, at least in part, by variable/programmable capacitors coupled between the gates of PMOS or NMOS transistor structures 618 and 619 and the common outputs of PMOS and NMOS transistor structures 618 and 619, which can be used to adjust or limit the respective negative and positive slew rates of the output of driver 220, and/or to reduce harmonic distortions in an output signal of driver 220. Variable/programmable current sources 616 and 617, in conjunction with cross link resistor 614, may be adjusted to fine tune the respective negative and positive achievable slew rates for driver 220 for different output signal characteristics and output impendences.

Also shown in FIG. 6 are VDD or high rail reference 302, ground or low rail reference 303, and load 630. In various embodiments, similar techniques to those used to regulate or bias multiple DACs 210 in a multichannel DDS 110, as shown in FIGS. 2-5, may be used to regulate or bias elements of driver 220. For example, VDD 302 and ground 303 may be replaced by virtual regulated high and low rails, respectively. In some embodiments, load 630 may be a test or reference load implemented within driver 220 and/or DDS 110, for example, and may be optionally multiplexed into one or more channels of DDS 110 so as to calibrate DDS 110, DAC 210, and/or driver 220. When in typical operational mode, load 630 may be removed from the output of driver 220 and output 622 provided directly to a sensor system (e.g., sensor system 150 over interface 106). In other embodiments, load 630 may be implemented as a supplemental load that may be used to help drive a sensor system attached to secondary/loaded output 632 according to a desired overall impedance. Similarly, driver 220 may include optional output resistor 620, which may be selected to move the dominate pole of the output circuitry of driver 220 outside a desired operating frequency of a signal buffered by driver 220. Such output resistor 620 may be used to reduce slew rate dependence on the driven load and to help balance positive and negative slew rate characteristics of driver 220, which helps reduce overall distortion in the output of driver 220. In some embodiments, output resistor 620 may be a 400 ohm resistor (e.g., assuming the minimum capacitive load is 15 pF). In various embodiments, output resistor 620 may be a variable/programmable resistor ranging in value from 50 to 5000 ohms, for example, or from 100 to 1000 ohms.

By introducing cross link resistor 614 connecting the gates of PMOS and NMOS transistor structures 618 and 619 controlled by current sources/sinks 616/617 and regulated by amplifiers 612 and 613, the driver 220 can achieve low power, fast response time, and relatively constant average output level. While cross link resistor 614 can be tuned to turn driver 220 off when inactive and achieve low power, it also helps driver 220 to achieve relatively fast response time when active. Amplifiers 612 and 613 provide additional paths to absorb differences in common mode voltage, thus enabling driver 220 to attain relatively flat average output levels. Benefits include: driver 220 is programmable, thus it can drive relatively large capacitive loads; as cross link resistor 614 is increased or decreased, driver 220 is turned off thereby resulting in a relatively small quiescent current, and so driver 220 enables fast switching; coarse-tuning and fine-tuning capabilities allows for excellent control of slew rate and harmonics; because the transconductance (e.g., gain gm) of driver depends upon drive current and input voltage (e.g., Vgs), gm can be kept relatively constant by adjusting the drive current as Vgs changes on input stage (e.g., at amplifiers 612 and 613).

Figure 7:
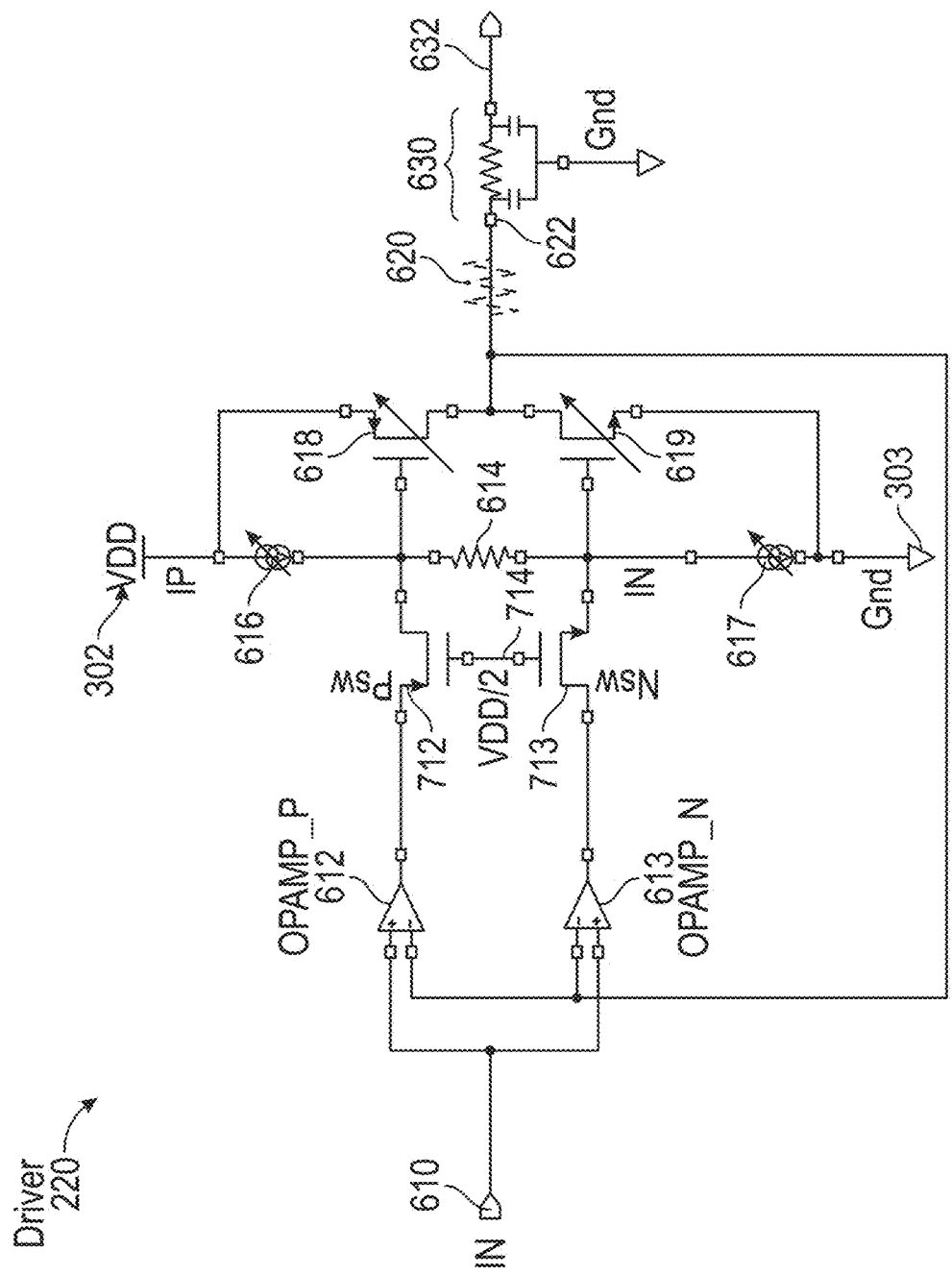
FIG. 7 is a block diagram illustrating a driver circuit for a direct digital synthesizer in accordance with an embodiment of the present disclosure.

FIG. 7 is a block diagram illustrating a driver 220 for DDS 110 in accordance with an embodiment of the present disclosure. Driver 220 of FIG. 7 includes all the same elements of driver 220 shown in FIG. 6, but additionally includes PMOS transistor 712 between the output of amplifier 612 and the gate of PMOS transistor structure 618, and NMOS transistor 713 between the output of amplifier 613 and the gate of NMOS transistor structure 619, where PMOS transistor 712 and NMOS transistor 713 are implemented with a common gate 714. As shown in FIG. 7, common gate 714 may be biased at VDD/2. In other embodiments, common gate 714 may be biased as half the difference between a high virtual rail and a low virtual rail, which may be regulated as described herein. Such structure may be used to reduce the risk of distortion of an output signal or waveform at output 622 or secondary output 632 caused by activation of PMOS transistor structure 618 while the input signal at input 610 is positive and/or by activation of NMOS transistor structure 619 while the input signal at input 610 is negative.

Embodiments of DDS 110 have been able to synthesize multiple simultaneous sine wave analog waveform outputs with peak to peak amplitudes at or above approximately 2.8V (accessing a VDD of approximately 3.3V) over a frequency range of 50 kHz to 2 MHz while driving capacitive loads ranging from 15-100 pF and with a reproducible channel to self and channel to channel accuracy of better than approximately +−5%. The typical power draw is less than 10 mW per channel and the $2^{nd}$ and $3^{rd}$ harmonic contributions to signal distortions are less than approximately −35 dB each.

Figure 8:
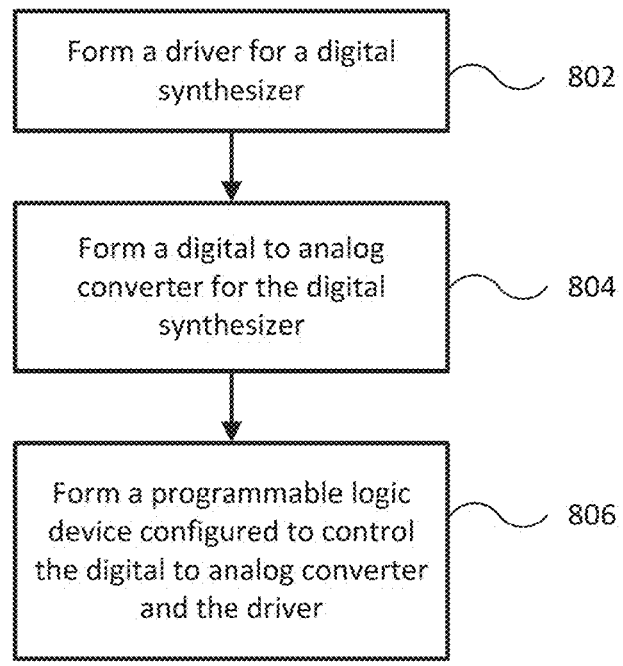
FIG. 8 illustrates a process to fabricate a direct digital synthesis system in accordance with an embodiment of the disclosure.

FIG. 8 illustrates a process 800 to fabricate DDS 110 and/or system 100 in accordance with an embodiment of the disclosure. In some embodiments, the operations of FIG. 8 may be implemented as software instructions executed by one or more logic devices associated with a semiconductor fabrication system configured to form devices, systems, sensors, and/or other structures depicted in FIGS. 1-7, including integrated circuit 102. More generally, the operations of FIG. 8 may be implemented with any combination of software instructions and/or electronic hardware (e.g., inductors, capacitors, amplifiers, actuators, or other analog and/or digital components). It should be appreciated that any step, sub-step, sub-process, or block of processes 800 may be performed in an order or arrangement different from the embodiments illustrated by FIG. 8. For example, in other embodiments, one or more blocks may be omitted from process 800, and other blocks may be included. Furthermore, block inputs, block outputs, various sensor signals, sensor information, calibration parameters, and/or other operational parameters may be stored to one or more memories prior to moving to a following portion of process 800. Although process 800 is described with reference to systems and other elements of FIGS. 1-7, process 800 may be performed to produce other systems and elements different from those depicted in FIGS. 1-7 and including a different selection of electronic devices and/or circuitry. At the initiation of process 800, various system parameters may be populated by prior execution of a process similar to process 800, for example, or may be initialized to zero and/or one or more values corresponding to typical, stored, and/or learned values derived from past operation of process 800, as described herein.

In block 802, a logic device forms driver 220 for DDS 110. For example, a controller for a semiconductor fabrication system, which may be similar to PLD 120, may be configured to form, on a substrate of integrated circuit 102, first and second differential amplifiers 612 and 613 coupled to input 610 of driver 220. Such differential amplifiers (e.g., and other elements of driver 220) may be formed primarily of PMOS or NMOS devices strategically so as to reduce layout constraints on fabrication of driver 220. The controller may also be configured to form PMOS transistor structure 618 coupled between high rail reference 302 and output 622 of driver 220 and to an output of first differential amplifier 612. The controller may also be configured to form NMOS transistor structure 619 coupled between low rail reference 303 and output 622 of driver 220 and to an output of second differential amplifier 613. In some embodiments, PMOS transistor structure 618 and NMOS transistor structure 619 may be variable transistor structures, as described herein.

The controller may additionally be configured to form feedback link 615 coupled between output 622 of driver 220 and inputs of first and second differential amplifiers 612/613. Moreover, the controller may be configured to form first and second variable current sources 616 and 617 on the substrate of integrated circuit 102, where the first variable current source 616 is coupled between high rail reference 302 and the output of first differential amplifier 612, and where the second variable current source 617 is coupled between second differential amplifier 613 and low rail reference 303. The controller may additionally be configured to form variable cross link resistor 614 coupled between the outputs of first and second differential amplifiers 612/613, for example, and/or to form PMOS transistor 712 coupled between the output of first differential amplifier 612 and first variable current source 616 and NMOS transistor 713 coupled between the output of second differential amplifier 613 and second variable current source 617, where PMOS transistor 712 and NMOS transistor 713 are coupled to each other by common gate 714 configured to be biased at approximately half a voltage difference between high rail reference 302 and low rail reference 303.

In block 804, a logic device forms DAC 210 for DDS 110. For example, a controller for a semiconductor fabrication system, which may be similar to PLD 120, may be configured to form, on a substrate of integrated circuit 102, decoder 310 coupled to input 309 of DAC 210, PMOS DAC 320 coupled between decoder 310 and output 361 of DAC 210, NMOS DAC 340 coupled between decoder 310 and output 361 of DAC 210, switch 360 coupled between outputs of PMOS DAC 320 and NMOS DAC 340 and output 361 of DAC 210; and bias circuitry 350 configured to bias PMOS DAC 320 and NMOS DAC 340 according to one or more desired bias voltages, as described herein. The controller may also be configured to form one or more variable current sources and/or other elements of bias circuity 350 and/or DAC 210. The controller may also be configured to form one or more variable current sources and/or other elements of bias regulator 570, filter 590, and/or DAC 510.

In block 806, a logic device forms PLD 120 for system 100 configured to control operation of DAC 210 and driver 220. For example, a controller for a semiconductor fabrication system, which may be similar to PLD 120, may be configured to form, on a substrate of integrated circuit 102, PLD 120. For example, PLD 120 may generally include one or more input/output (I/O) blocks and logic blocks (e.g., also referred to as programmable logic blocks (PLBs), programmable functional units (PFUs), or programmable logic cells (PLCs)), serializer/deserializer (SERDES) blocks, hard intellectual property core (IP) blocks, blocks of memory, clock-related circuitry (e.g., clock sources, PLL circuits, and/or DLL circuits), and/or various routing resources (e.g., interconnect and appropriate switching logic to provide paths for routing signals throughout PLD 120, such as for clock signals, data signals, or others) as appropriate. Such blocks may be programmed and/or otherwise used to control operation of DAC 210 and driver 220. In additional embodiments, the controller for the semiconductor fabrication system may be configured to form other elements of FIGS. 1-7 on a substrate of integrated circuit 102, such as elements of sensor system 150, other modules 130, and/or other modules 230.

By employing the methods described herein, embodiments of the present disclosure are able to provide relatively low power and accurate digital synthesizers. Moreover, embodiments including driver 220 are able to provide DDSs that can be used to drive relatively large capacitive loads with sinusoidal waveforms across relatively wide frequency bands substantially without wave distortion, as described herein.

Figure 9:
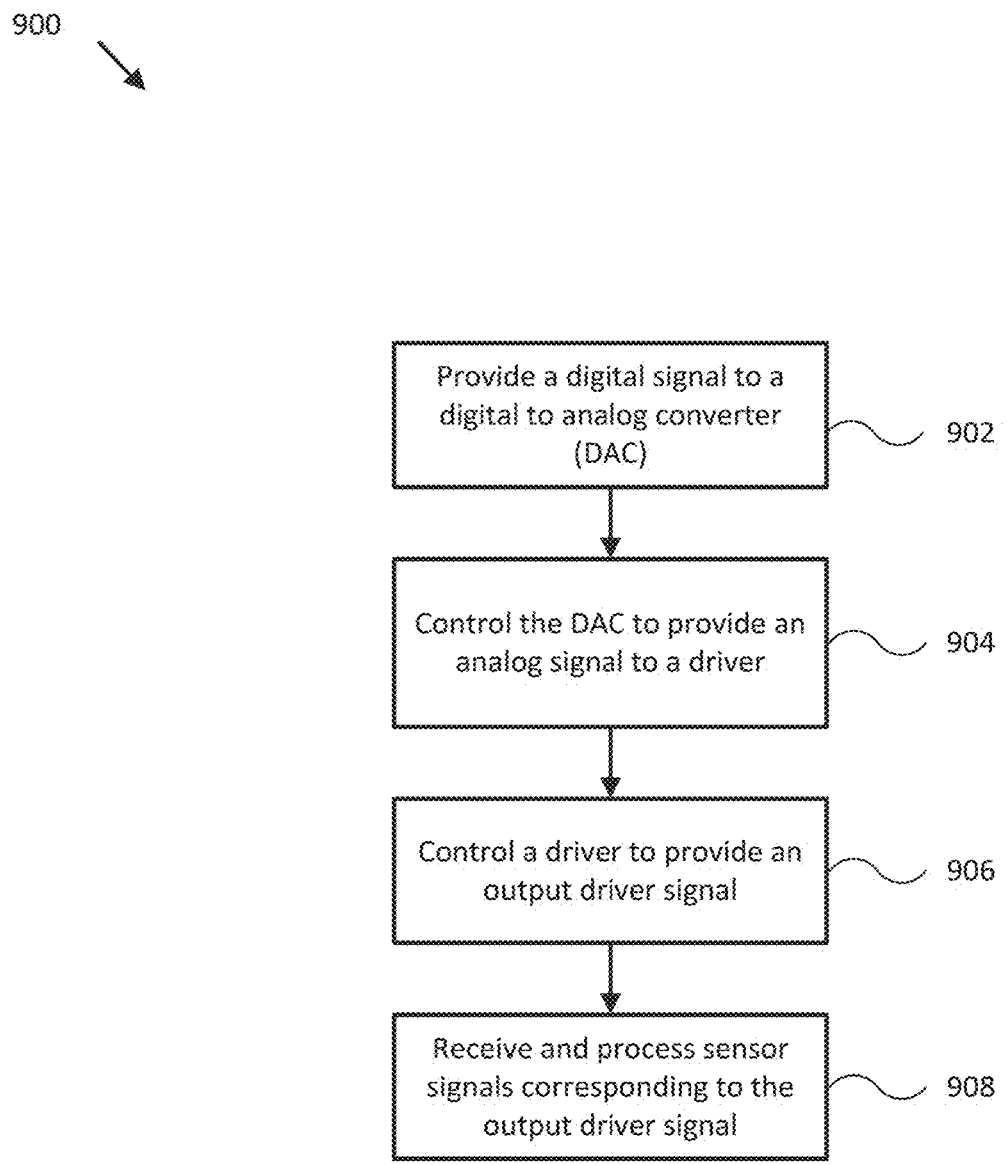
FIG. 9 illustrates a process to operate a direct digital synthesis system in accordance with an embodiment of the disclosure.

FIG. 9 illustrates a process 800 to operate DDS 110 and/or system 100 in accordance with an embodiment of the disclosure. In some embodiments, the operations of FIG. 9 may be implemented as software instructions executed by one or more logic devices associated with devices, systems, sensors, and/or other structures depicted in FIGS. 1-7, including integrated circuit 102. More generally, the operations of FIG. 9 may be implemented with any combination of software instructions and/or electronic hardware (e.g., inductors, capacitors, amplifiers, actuators, or other analog and/or digital components). It should be appreciated that any step, sub-step, sub-process, or block of processes 900 may be performed in an order or arrangement different from the embodiments illustrated by FIG. 9. For example, in other embodiments, one or more blocks may be omitted from process 900, and other blocks may be included. Furthermore, block inputs, block outputs, various sensor signals, sensor information, calibration parameters, and/or other operational parameters may be stored to one or more memories prior to moving to a following portion of process 900. Although process 900 is described with reference to systems and other elements of FIGS. 1-7, process 900 may be performed to produce other systems and elements different from those depicted in FIGS. 1-7 and including a different selection of electronic devices and/or circuitry. At the initiation of process 900, various system parameters may be populated by prior execution of a process similar to process 900, for example, or may be initialized to zero and/or one or more values corresponding to typical, stored, and/or learned values derived from past operation of process 900, as described herein.

In block 902, a logic device provides a digital signal to DAC 210. For example, PLD 120 may be configured to provide digital signal 309 to decoder 310 of DAC 210. Decoder signal 310 may be configured to decode digital signal 309 and provide corresponding control signals to PMOS DAC 320 and NMOS DAC 340 and switch 360 in order to generate output analog signal/waveform 362, as described herein.

In block 904, a logic device controls DAC 210 to provide analog signal 362 to driver 220. For example, PLD 120 may be configured to control variable/programmable elements of DAC 210 and/or DAC 510 to provide analog signal/waveform 362 to driver 220 substantially without distortion of waveform 362, as described herein. In some embodiments, PLD 120 may be configured to control elements of filter 590 to filter an output analog signal and/or waveform according to a desired pass band, as described herein.

In block 906, a logic device controls driver 220 to provide an analog driver output signal. For example, PLD 120 may be configured to control variable/programmable elements of driver 220 to provide an analog driver output signal at output 622, at secondary output 632, and/or to a load (e.g., sensor system 150 and/or test load 630), as described herein. For example, PLD 120 may be configured to control variable PMOS and NMOS transistor structures 618 and 619 to adjust respective negative and positive slew rates of driver 220, independently of one another. In some embodiments, variable PMOS and NMOS transistor structures 618 and 619 may be configured to provide relatively coarse adjustment of the negative and positive slew rates of driver 220. PLD 120 may also be configured to control first and second variable current sources 616 and 617 to adjust respective negative and positive slew rates of driver 220. In some embodiments, first and second variable current sources 616 and 617 may be configured to provide relatively fine adjustment of the negative and positive slew rates of driver 220. PLD 120 may also be configured to control variable cross link resistor 614 to adjust negative and positive slew rates of driver 220 and/or a quiescent current of driver 220. In some embodiments, such control of variable cross link resistor 614 may be performed along with control of first and second variable current sources 616 and 617 to provide relatively fine adjustment of the negative and positive slew rates of driver 220.

In block 908, a logic device receives and/or processes sensor signals corresponding to the output driver signal generated in block 906. For example, PLD 120 may be configured to receive analog and/or digital sensor signals from sensor system 150 and/or other modules 130, for example, and process the sensor signals to measure and/or detect an event sensed by sensor system 150, as described herein. In some embodiment, such sensor signals may indicate a change in a signal characteristic of the sensor signals and/or relative to the provided driver output signal corresponding to a physical event detectable by sensor system 150.

Thus, by employing the methods described herein, embodiments of the present disclosure are able to operate relatively low power and accurate digital synthesizers. Moreover, embodiments including driver 220 are able to provide DDSs that can be used to drive relatively large capacitive loads with sinusoidal waveforms across relatively wide frequency bands substantially without wave distortion, as described herein. The increased reliability and range of driveable loads allows embodiments to drive a larger selection of sensor systems within power limits typically associated with mobile devices.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A digital to analog converter (DAC) comprising:
   a decoder coupled to an input of the DAC;
   a PMOS DAC coupled between the decoder and an output of the DAC;

an NMOS DAC coupled between the decoder and the output of the DAC;
a switch coupled between outputs of the PMOS DAC and the NMOS DAC and the output of the DAC and configured to select the output of the PMOS DAC or the output of the NMOS DAC as the output of the DAC based, at least in part, on a control signal provided to the switch by the decoder; and
bias circuitry configured to bias the PMOS DAC and the NMOS DAC according to one or more desired bias voltages.

2. The DAC of claim 1, wherein:
the PMOS DAC comprises a plurality of PMOS transistors controlled by the decoder;
the NMOS DAC comprises a plurality of NMOS transistors controlled by the decoder; and
the plurality of PMOS transistors and the plurality of NMOS transistors are arranged to form at least respective portions of a differential current steering DAC.

3. The DAC of claim 2, wherein:
the plurality of PMOS transistors and the plurality of NMOS transistors each comprise at least 128 transistors; and
the DAC is configured to implement at least an 8-bit DAC.

4. The DAC of claim 2, wherein:
the decoder is configured to provide a most significant bit of a digital signal provided to the decoder as the control signal provided to the switch; and
the switch is configured to select an output of the PMOS DAC or the NMOS DAC to generate a corresponding negative or positive portion of an analog signal provided by the output of the DAC.

5. The DAC of claim 1, wherein:
the PMOS DAC comprises a PMOS DAC common bias coupled to a high rail reference through a variable PMOS DAC current source;
the NMOS DAC comprises an NMOS DAC common bias coupled to a low rail reference through a variable NMOS DAC current source; and
the bias circuitry comprises:
an internal PMOS DAC reference rail coupled to the PMOS DAC and configured to bias the PMOS DAC by the voltage difference between the PMOS DAC common bias and the internal PMOS DAC reference rail; and
an internal NMOS DAC reference rail coupled to the NMOS DAC and configured to bias the NMOS DAC by the voltage difference between the NMOS DAC common bias and the internal NMOS DAC reference rail.

6. The DAC of claim 5, wherein:
the internal PMOS DAC reference rail is coupled to the low rail reference; and
the internal NMOS DAC reference rail is coupled to the high rail reference.

7. The DAC of claim 1, wherein:
the PMOS DAC comprises a PMOS DAC common bias coupled to a high rail reference through a variable PMOS DAC current source;
the NMOS DAC comprises an NMOS DAC common bias coupled to a low rail reference through a variable NMOS DAC current source;
the bias circuitry comprises first and second variable current sources coupled in series between the high rail reference and the low rail reference and configured to generate a common bias therebetween; and
the variable PMOS DAC current source is linked to and controlled by the first variable current source via a first bias control reference and the variable NMOS DAC current source is linked to and controlled by the second variable current source via a second bias control reference.

8. The DAC of claim 7, further comprising:
a first feedback element coupled between the common bias generated between the first and second variable current sources, the PMOS DAC common bias, and the first bias control reference; and
a second feedback element coupled between the common bias, the NMOS DAC common bias, and the second bias control reference;
wherein the first and second feedback elements are configured to compensate for drift or voltage differences between the common bias and the respective DAC common biases by adjusting respective first and second bias control references.

9. The DAC of claim 8, wherein:
the first and second feedback elements comprise differential amplifiers with outputs coupled to the respective first bias control references.

10. The DAC of claim 1, further comprising:
a bias regulator configured to select, regulate, or otherwise control an internal PMOS DAC reference rail for the PMOS DAC and/or an internal NMOS DAC reference rail for the NMOS DAC.

11. The DAC of claim 1, further comprising:
an output filter coupled between the switch and the output of the DAC and configured to filter an output analog signal of the DAC according to a desired pass band.

12. A digital synthesizer comprising the DAC of claim 1, wherein:
the digital synthesizer comprises a multichannel digital synthesizer comprising a plurality of channels; and
each one of the plurality of channels of the multichannel digital synthesizer comprises one DAC according to claim 1.

13. A system comprising the DAC of claim 1, the system further comprising:
a driver, wherein the output of the DAC is coupled to an input of the driver; and
a programmable logic device (PLD) coupled to an input of the DAC;
wherein the PLD is configured to provide a digital signal to the DAC and the DAC is configured to convert the digital signal to a corresponding analog signal and provide the corresponding analog signal to the input of the driver.

14. The system of claim 13, wherein:
the driver is configured to generate an output driver signal based on the corresponding analog signal provided by the DAC and provide the output driver signal to a sensor system; and
the PLD is configured to receive sensor signals from the sensor system, corresponding to the output driver signal, and process the sensor signals to measure and/or detect an event sensed by the sensor system.

15. The system of claim 13, wherein:
the PLD is configured to control one or more variable current sources of the bias circuitry to adjust respective bias voltages across the PMOS DAC and/or the NMOS DAC.

16. A method for fabricating a digital to analog converter (DAC) for a digital synthesizer in an integrated circuit, the method comprising:

forming, on a substrate of the integrated circuit, a decoder coupled to an input of the DAC;

forming a PMOS DAC coupled between the decoder and an output of the DAC;

forming an NMOS DAC coupled between the decoder and the output of the DAC;

forming a switch coupled between outputs of the PMOS DAC and the NMOS DAC and the output of the DAC and configured to select the output of the PMOS DAC or the output of the NMOS DAC as the output of the DAC based, at least in part, on a control signal provided to the switch by the decoder; and forming bias circuitry configured to bias the PMOS DAC and the NMOS DAC according to one or more desired bias voltages.

17. The method of claim 16, wherein:

the PMOS DAC comprises a PMOS DAC common bias coupled to a high rail reference through a variable PMOS DAC current source;

the NMOS DAC comprises an NMOS DAC common bias coupled to a low rail reference through a variable NMOS DAC current source;

the bias circuitry comprises first and second variable current sources coupled in series between the high rail reference and the low rail reference and configured to generate a common bias therebetween; and the variable PMOS DAC current source is linked to and controlled by the first variable current source via a first bias control reference and the variable NMOS DAC current source is linked to and controlled by the second variable current source via a second bias control reference.

18. The method of claim 17, further comprising:

forming a first feedback element coupled between the common bias generated between the first and second variable current sources, the PMOS DAC common bias, and the first bias control reference; and forming a second feedback element coupled between the common bias, the NMOS DAC common bias, and the second bias control reference;

wherein the first and second feedback elements are configured to compensate for drift or voltage differences between the common bias and the respective DAC common biases by adjusting respective first and second bias control references.

19. A method for operating a digital to analog converter (DAC) for a digital synthesizer, the method comprising:

controlling the DAC to provide an analog signal to an input of a driver, wherein the DAC comprises:

a decoder coupled to an input of the DAC;

a PMOS DAC coupled between the decoder and an output of the DAC;

an NMOS DAC coupled between the decoder and the output of the DAC;

a switch coupled between outputs of the PMOS DAC and the NMOS DAC and the output of the DAC and configured to select the output of the PMOS DAC or the output of the NMOS DAC as the output of the DAC based, at least in part, on a control signal provided to the switch by the decoder; and bias circuitry configured to bias the PMOS DAC and the NMOS DAC according to one or more desired bias voltages; and controlling one or more variable current sources of the bias circuitry to adjust respective bias voltages across the PMOS DAC and/or the NMOS DAC.

20. The method of claim 17, further comprising:

providing a digital signal to the DAC configured to cause the DAC to generate the analog signal provided to the input of the driver.

* * * * *